United States Patent [19]

Hayden

[11] 4,259,545

[45] Mar. 31, 1981

[54] HIGH VOLTAGE SAFETY-GLOW INSULATOR

[76] Inventor: Robert K. Hayden, P.O. Box 488, La Plata, Md. 20646

[21] Appl. No.: 108,690

[22] Filed: Dec. 31, 1979

[51] Int. Cl.³ .................. H01B 17/20; G01R 19/145; G08B 21/00

[52] U.S. Cl. .................................... 174/139; 324/133; 340/654

[58] Field of Search ..................... 174/30, 137 R, 139, 174/140 R, 141 R, 194, 195, 202, 206, 210; 313/323; 324/72, 122, 133; 340/28, 657, 659, 660, 664, 635, 647, 652, 654; 361/107, 132

[56] References Cited

U.S. PATENT DOCUMENTS

| | | | |
|---|---|---|---|
| 2,026,770 | 1/1936 | Bergman | 174/139 X |
| 2,392,342 | 1/1942 | Steinmayer | 174/140 R |
| 3,328,690 | 6/1967 | Lockie et al. | 324/122 |
| 4,171,523 | 10/1979 | Parkitny | 340/654 |

FOREIGN PATENT DOCUMENTS

| | | | |
|---|---|---|---|
| 312079 | 10/1933 | Italy | 324/72 |

*Primary Examiner*—Laramie E. Askin

*Attorney, Agent, or Firm*—Eric P. Schellin

[57] ABSTRACT

The invention provides a relatively simple and inexpensive means of alerting electric power line maintenance crews and uninformed citizenry as to whether or not electric power lines, whether overhead or damaged and on the ground, are energized. This is done by combining with the conventional insulator which is used to support a power line conductor a glow lamp or fluorescent indicator which lights up when the conductor is energized.

7 Claims, 6 Drawing Figures

HIGH VOLTAGE SAFETY-GLOW INSULATOR

BRIEF DESCRIPTION OF THE INVENTION

The invention combines a gas-discharge glow lamp with a distribution or transmission line insulator for an electric power line. When the conductor of the power line is electrified at the high voltage of distribution or transmission, the glow lamp of the insulator, to which the conductor is attached, will be excited by the electrostatic field emitted by the line. The resulting luminescent glow in the glow lamp acts as a visual signal to alert persons that the line is energized, and dangerous to approach.

VIEWS OF DRAWING

DETAILED DESCRIPTION

Figure 1:
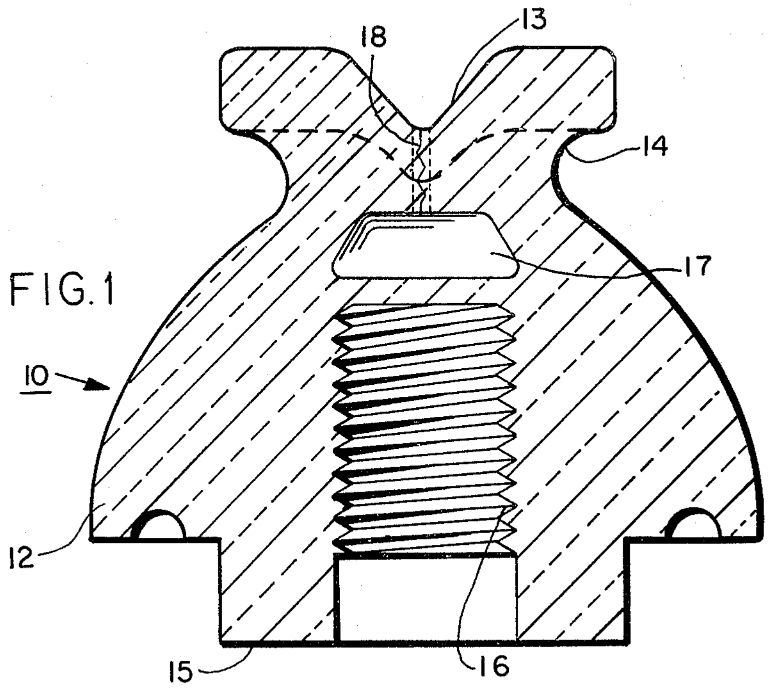
FIG. 1 is a cross sectional view of one embodiment of the invention, in which a glow lamp and a pin insulator are integral.

In appearance, size, weight, ease of installation, and performance, the high voltage safety-glow insulator would be essentially identical to those now in common use. In most cases the design would have to be altered to allow for a raised dome (crown) of translucent ceramic material large enough to contain between five and ten cubic centimeters of gas for either neon or fluorescent illumination. The inside of the gas chamber would be connected to the outside by a conductor. This conductor would be completely sealed in a channnel in the hollow crown to protect and contain the gas therein. This conductor would energize the gas within the crown by transmitting it to a continuing or intermittent charge picked up from the electrostatic field normally emitted by distributor lines during power distribution. The insulator illumination would require no direct electrical contact with the power lines. It would be placed in the usual position to perform as any transmission or distribution line insulator is designed to do. It is understood that because of the uncertain regularity and availability of such electric power at one time at one place, the new insulator often would be characterized by a flickering light.

The high voltage safety-glow insulator would be useful and most desirable on distribution power poles carrying the normal 7,200 to 12,000 volt lines which feed electric power into commercial and residential areas. The purpose of the invention is to reduce the hazards from live but damaged power lines down in either urban or suburban areas of dense or relatively dense population. The glowing insulator would tell both power company repair personnel and all others, especially children, that a downed line remains extremely dangerous; if the insulators atop the pole continue to glow or flicker the line remains deadly. Glass domes of the newly designed insulators should be tinted red for maximum visibility day or night. To reduce possible vandalism losses, the flared or skirted style insulator is most suitable for the proposed type. This is why the translucent glass chamber should be at the top of the insulator. The flaring of the insulator skirt protects, to some degree, the exposed glass dome from objects thrown from the ground.

An adaptor for in-place installed insulators would perform the same as the whole newly designed device described above. It would be the same size so far as the gas chamber is concerned and would be charged and energized the same way. The chamber, made of tempered translucent glass, would be mounted atop an existing in-place insulator with the filament hole formed through the top to where the power line touches the adaptor. The adaptor top would be formed to accept the line just as the conventional insulator is formed at that point. It would be held in place by means of two "handles" or two drilled holes, one on each side of the adaptor. The adaptor would be fastened to the top of the insulator by means of a commonly procurable plastic self-tightening strap placed through the two "handles" or holes and then around and in the groove commonly found on presently used insulators. The bottom of the adaptor would be slightly flared to facilitate secure positioning atop the insulator. This adaptor would measure about three inches in diameter at flared bottom, two and ½ inches at top, and two inches in height.

Figure 5:
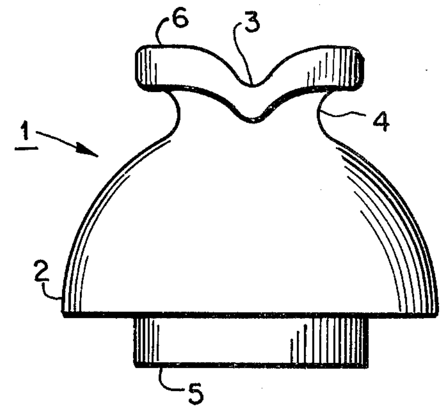
FIG. 5 PRIOR ART
FIGS. 5 and 6 are end and top views of a conventional insulator.
Figure 6:
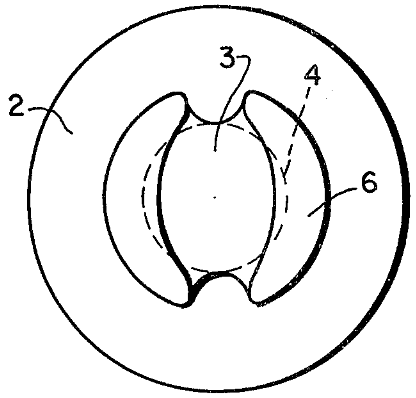
FIG. 6 PRIOR ART

The conventional type of insulator now used in moderate high voltage electric distribution is shown in prior-art FIGS. 5 and 6. Such distribution is at levels of about 7,200 to 12,000 volts AC. The insulator 1 has a conductor support groove 3 in its crown 6 in which the line conductor is supported. The line conductor is secured in place by tiedowns which wrap around the holddown groove 4. The insulator includes a skirt 2 and a base 5 which is hollow and is supported by an insert, usually a threaded pin, not shown, which engages the hollow.

One preferred embodiment of the invention is seen in FIG. 1. It will be noted that the general shape of the insulator of FIG. 1 is closely similar to that of the prior art insulator of FIGS. 5 and 6. In fact, the two insulators are directly interchangeable. In FIG. 1 the insulator 10 is formed of glass or a translucent ceramic material. The insulator has the customary skirt 12, powerline support groove 13, holdown groove 14 and base 15. The insulator 10, in use, is supported by a threaded pin, not shown, which engages the threaded bore 16. In the upper portion of the insulator, spaced from all surfaces, is a hollow chamber 17 which is filled with a gas, such as neon, or with an electroluminescent material. A filamentary connector 18 provides a low resistance connection between the chamber 17 and the exterior surface.

In the device of FIG. 1, there is no closed metallic loop circuit involving two conductors, such as is found in ordinary electric circuits. However, the presence of filamentary connector 18 and the close juxtaposition of the power conductor inherently produce voltage stresses in chamber 17 which will cause the gas filling or electroluminescent material to glow. It is noted that the voltages at portions of the chamber 17 remote from filamentary connector 18 are determined by purely capacitive voltage-divider action between the line and ground, while the voltage divider circuit adjacent the filamentary connector 18 is partly conductive. The resulting unequal voltage division ratios produce voltage stresses in chamber 17.

Figure 2:
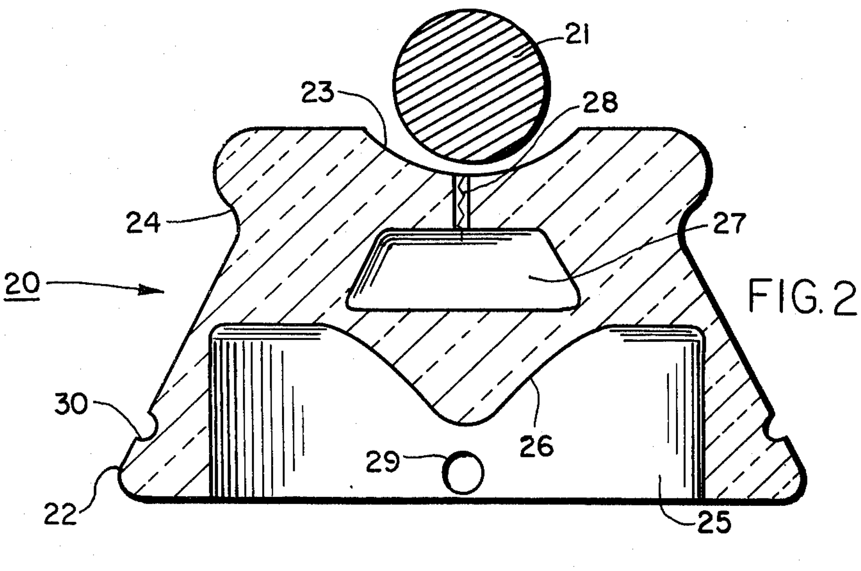
FIG. 2 is a cross sectional view of a glow lamp adapter suited for attachment to an in-place conventional insulator.

In FIG. 1 the insulator 10 is unitary and integral with its safety-glow indicator. However, a safety-glow indicator could be added to an in-place conventional insulator, such as that of FIGS. 5 and 6. Such a preferred embodiment is illustrated in FIGS. 2, 3 and 4.

Adapter 20 is constructed of glass or translucent ceramic and has the usual powerline support groove 23 and holddown groove 24 to support and clamp in place powerline 21. The skirt 22 surrounds a recess 25, which has a protruding portion 26. The size of the recess 25 and the protruding portion 26 is such as to fit closely over the crown 6 of the prior art insulator 1 of FIGS. 1, 2 whereby it is possible to seat adaptor 20 on insulator 1. The upper portion of adapter 20 is provided with a chamber 27 and a filament connector 28, which function similarly to the chamber 17 and filament connector 18 of FIG. 1. The skirt 22 is provided with two diametrically spaced holes 29 (of which only the farther one is seen in the cross sectional view of FIG. 2) and a circumferential groove 30 which is faired into the holes 29.

Figure 3:
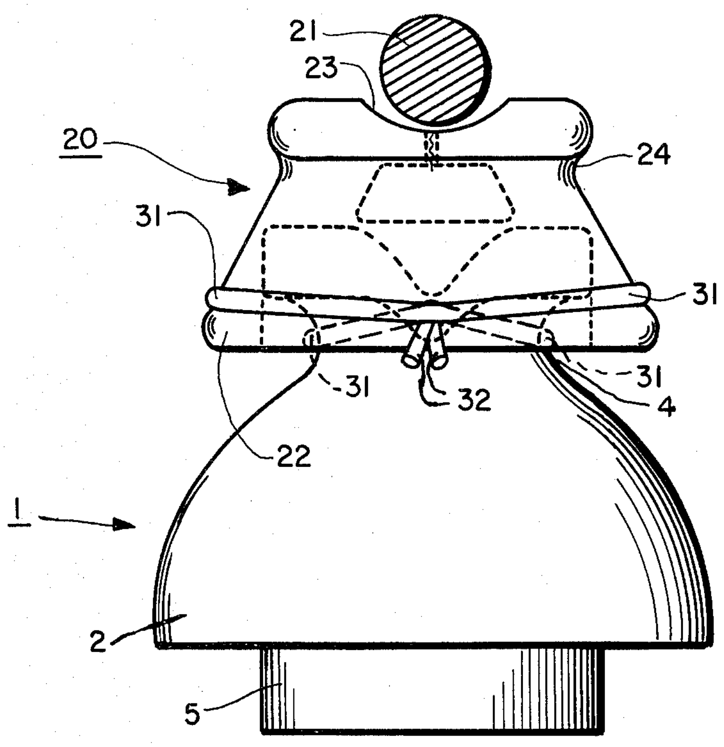
FIG. 3 is a view of the adapter of FIG. 2 in place on a conventional insulator.
Figure 4:
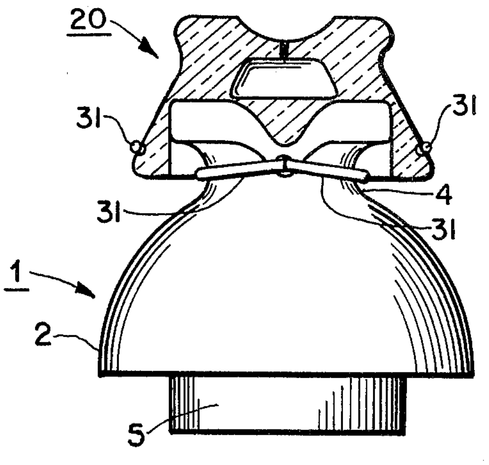
FIG. 4 is a view similar to FIG. 3 but with the adapter shown in cross section.

When the adapter 20 is seated onto a prior art insulator 1, as illustrated in FIG. 3, it is fastened onto the insulator 1 by means of a plastic self-tightening securing strap 31. The securing strap 31 is applied as follows: The securing strap is folded in half and the doubled length is threaded through the two holes 29 in succession so that a doubled strap passes through the holes in a straight line. Then the paired straps 31 inside the recess 25 are spread apart, fitted over the crown and into the holddown groove 4 of the prior art insulator 1, and the adapter 20 is seated on the crown 6. The bight which projects from one of the holes 29 is then opened, bent back and fitted into the groove 30. The free ends 32 which project from the other hole 29 are then pulled to tension the securing strap 31, and the excess material is trimmed off.

It will be seen that the tension in securing strap 31 causes it to press on the free ends 32 and squeeze said free ends against the edge of hole 29. This prevents the free ends 32 from slipping to release the tension. FIG. 4 shows the lay of the securing strap in holddown groove 4.

From the above description, it is seen that the high voltage safety-glow insulator is useful and advantageous as follows, in that it would:

(a) Help reduce accidents involving untrained, careless contact with live power lines by other than electric power company employees;

(b) Help electric power company crews locate power line breakages;

(c) Remind apprentice and exhausted line repair personnel about the presence of live power in lines being repaired;

(d) Help citizenry direct power company crews more precisely to storm and accident related emergency problems where downed live wires cause extremely hazardous situations;

(e) Give the electric power companies another useful tool to be used in educating the public about the dangers inherent in exposure to damaged electrical power poles and lines.

I claim:

1. An insulator for a high voltage transmission line;
said insulator having a bottom end and a top end;
said insulator having, at its top end, means to attach an electrical conductor to said top end; in combination with
a safety-glow indicator for indicating whether or not the said electrical conductor is energized;
said safety-glow indicator comprising a closed chamber, located in the upper portion of said insulator, and filled with an electroluminescent material;
a filament connector terminating at said chamber and extending therefrom upwardly to the top of said insulator, said filament connector being sealed in said insulator;
the material of said insulator adjacent said chamber being at least translucent;
whereby, when said insulator is associated with a conductor which is energized, said electroluminescent material will glow;
thereby signalling the electrified condition of said conductor.

2. The subject matter of claim 1 in which:
said electroluminescent material is a gas filling.

3. The subject matter of claim 2 in which:
said gas filling comprises neon.

4. The subject matter of claim 1 in which:
said insulator is an integral one-piece body of ceramic and
said chamber is located within said integral one-piece body of ceramic.

5. The subject matter of claim 4 in which:
said integral one-piece body of ceramic is glass.

6. The subject matter of claim 1 in which:
said chamber is formed in one piece of ceramic which includes said top end;
said one piece of ceramic being fastened to another piece of ceramic which includes said bottom end.

7. Subject matter under claim 6 in which:
said one piece is fastened to said another piece by means of a securing strap.

* * * * *